United States Patent [19]

Matsutomo

[11] Patent Number: 5,969,412
[45] Date of Patent: Oct. 19, 1999

[54] TAPE-FIXED LEADFRAME

[75] Inventor: Mitsuhiro Matsutomo, Kumamoto, Japan

[73] Assignee: NEC Corporation, Tokyo, Japan

[21] Appl. No.: 09/056,598

[22] Filed: Apr. 8, 1998

[30] Foreign Application Priority Data

Apr. 9, 1997 [JP] Japan .................................. 9-090582

[51] Int. Cl.⁶ .......................... H01L 23/495; H01L 23/53; H01L 23/48; H01L 23/28
[52] U.S. Cl. ........................... 257/670; 257/666; 257/668; 257/669; 257/674; 257/700; 257/783; 257/787
[58] Field of Search ..................... 257/666, 668, 257/670, 674, 669, 700, 783, 787; 438/118, 119, 123, 127

[56] References Cited

U.S. PATENT DOCUMENTS

| 5,176,366 | 1/1993 | Masumoto et al. | 257/670 |
| 5,847,458 | 12/1998 | Nakamura et al. | 257/738 |

FOREIGN PATENT DOCUMENTS

| 61-154151 | 7/1986 | Japan . |
| 61-268090 | 11/1986 | Japan . |
| 63-073547 | 4/1988 | Japan . |
| 6-310653 | 11/1994 | Japan . |
| 2 199 988 | 7/1988 | United Kingdom . |

*Primary Examiner*—Olik Chaudhuri
*Assistant Examiner*—Alonzo Chambliss
*Attorney, Agent, or Firm*—Young & Thompson

[57] ABSTRACT

A tape-fixed leadframe is provided, which prevents ion migration of metal contained in leads with a simple configuration. The leadframe is comprised of electrically-conductive lead fingers and an electrically-insulating tape for fixing the lead fingers. The tape includes an electrically-insulating base film and an electrically-insulating adhesive layer formed on a surface of the base film. The adhesive layer of the tape is adhered to the lead fingers, thereby fixing the lead fingers at their original positions. The adhesive layer has protruded parts located at respective sides of each of the lead fingers, intervening parts between two adjoining ones of the protruded parts, and depressed parts opposite to the lead fingers. The protruded parts are thicker than the intervening parts. The depressed parts are thinner than the intervening parts. Ionized atoms of a metal contained in the lead fingers are trapped by the protruded parts and as a result, ion migration of the metal is prevented from occurring with a simple configuration.

3 Claims, 4 Drawing Sheets

TAPE-FIXED LEADFRAME

BACKGROUND OF THE INVENTION

1. Field of the Invention

The present invention relates to a leadframe used for plastic-molded semiconductor devices and more particularly, to a leadframe whose inner leads are fixed by an electrically insulating tape to prevent short circuit between the inner leads, and a method of fabricating the tape-fixed leadframe.

2. Description of the Prior Art

In recent years, the integration level of Large-Scale Integrated circuits (LSIs) has been becoming higher and higher, and the capacity of the LSIs have been becoming larger and larger. According to the tendency, the LSI package has been miniaturized and at the same time, the lead count has been increased, resulting in decrease of the lead pitch.

In plastic-molded or encapsulated LSIs, to cope with the decreasing lead pitch, a leadframe whose inner leads are fixed by an electrically insulating tape, which is termed the tapefixed leadframe, was developed. In this tape-fixed leadframe, the inner leads are prevented from being shifted from their original positions by flow of a molten encapsulation material (for example, epoxy resin) during a plastic molding process. Therefore, no short circuit phenomenon will occur among the inner leads.

A conventional tape-fixed leadframe is schematically shown in FIGS. 1 and 2. in FIG. 1, a fixing tape 101 is formed by an electrically-insulating base film 101a and an adhehsive layer 102 coated on one side of the base film 101a. The base film 101a is made of an electrically-insulating, organic material such as polyimide. The adhesive layer 102 is made of a mixture of a Nitrile-Butadien Rubber (NBR) and a synthetic resin such as phenol resin.

The reference numeral 116a denotes aligned inner leads 116a of the conventional tape-fixed leadframe, which is typically made of a copper (Cu)-system alloy. The fixing tape 101 attached to the inner leads 116a by pressing the adhesive layer 102 to the inner leads 116a by a weak force. Thus, the inner leads 116a are fixed at their original positions by the adhesion strength of the adhesive layer 102 so that two adjacent ones of the inner leads 116a are prevented from being contacted with one another.

The pitch of the inner leads 116a is, for example, 0.2 mm.

After the plastic molding process, the inner leads 116a and the fixing tape 101 are buried in a molding or encapsulating material 107 such as epoxy resin, as shown in FIG. 2.

When an electric potential difference (i.e., voltage) is generated between two adjacent ones of the inner leads 116a during operation of the LSI using the conventional tape-fixed leadframe, copper (Cu) atoms contained in the inner leads 116a tend to be ionized due to the electric field generated by the electric potential difference. The ionization of the copper atoms occurs at the positive-side ones of the inner leads 116a. The ionized copper atoms then diffuse in the adhesive layer 102 of the fixing tape 101 toward the neighboring negative-side ones of the inner leads 116a, resulting in deposition of metallic copper 104. This phenomenon has been termed the "ion migration" of copper.

As a result, finally, electrical short circuit takes place between the adjoining positive- and negative-side ones of the inner leads 116a due to the deposited metallic copper 104. This means that the LSI is defective.

It is known that the ion migration of copper is caused by the fact that the copper ions readily move or diffuse within the adhesive layer 102 of the tape 101, and that the electrical conductivity of the adhesive layer 102 is higher than that of epoxy resin serving as the molding or encapsulating material 107.

With the conventional tape-fixed leadframe, as shown in FIG. 1. the thickness of the adhesive layer 102 is substantially uniform over the whole length. In this case, the deposited metallic copper 104 exists in the surface region 108 of the adhesive layer 102 between the two adjoining ones of the inner leads 116a. The deposited metallic copper 104 seems to grow from one of the inner leads 116a to adjoining another.

To prevent the ion migration of copper, an improvement has been developed in which depressions or recesses are formed between the adjoining ones of the inner leads 116a. This improvement corresponds to an application of the technique relating to a printed wiring board which is disclosed in the Japanese Non-Examined Patent Publication No. 61-268090 published in November 1986.

In this improvement, since the depressions or recesses increase the necessary distance of the ionized copper atoms to be diffused for electrical short circuit, the ion migration of copper is prevented or suppressed.

However, in the above improvement, there arises a problem that the lead-fixing operation for the inner leads 116a disappears or largely degrades. This is caused by the fact that the fixing tape 101 has a thickness as small as approximately 50 μm and consequently, the mechanical strength of the tape 101 is lowered to an unsatisfactory level because of the depressions or recesses.

The mechanical strength of the fixing tape 101 having the depressions or recesses may be increased to a satisfactory level by reinforcing the base film 101a. However, there arises another problem that the fabrication cost is raised due to the use of the reinforced base film 101a, the process of forming the depressions or recesses is essentially added, and the adhesion strength of the tape 101 is decreased.

Consequently, the above improvement is not practical and any other solution is necessary.

SUMMARY OF THE INVENTION

Accordingly, an object of the present invention is to provide a tape-fixed leadframe that prevents ion migration of a metal contained in leads with a simple configuration.

Another object of the present invention is to provide a fabrication method of a tape-fixed leadframe that prevents ion migration of a metal contained in leads with simple steps.

The above objects together with others not specifically mentioned will become clear to those skilled in the art from the following description.

According to a first aspect of the present invention, a tape-fixed leadframe is provided, which is comprised of electrically-conductive lead fingers and an electrically-insulating tape for fixing the lead fingers.

The tape includes an electrically-insulating base film and an electrically-insulating adhesive layer formed on a surface of the base film. The adhesive layer of the tape is adhered to the lead fingers, thereby fixing the lead fingers at their original positions.

The adhesive layer has protruded parts located at respective sides of each of the lead fingers, intervening parts between two adjoining ones of the protruded parts, and depressed parts opposite to the lead fingers.

The protruded parts are thicker than the intervening parts. The depressed parts are thinner than the intervening parts.

With the tape-fixed leadframe according to the first aspect of the present invention, the adhesive layer has the protruded parts located at the respective sides of each of the lead fingers and the intervening parts between two adjoining ones of the protruded parts. Therefore, ionized atoms of a metal contained in the lead fingers are trapped by the protruded parts and as a result, ion migration of the metal is prevented from occurring with a simple configuration.

In a preferred embodiment of the tape-fixed leadframe according to the first aspect, the thickness of the protruded parts is equal to approximately twice as much as the thickness of the intervening parts or more. In this case, the advantage of the present invention is ensured.

Any metallic material may be used for the leadframe.

Any electrically-insulating material may be used for the base film of the tape if it has a satisfactory mechanical strength.

Any electrically-insulating material may be used for the adhesive layer of the tape if it has a satisfactory adhesion strength.

According to a second aspect of the present invention, a method of fabricating the tape-fixed leadframe according to the first aspect is provided, which is comprised of the following steps.

(a) A leadframe having electrically-conductive lead fingers is prepared.

(b) An electrically-insulating tape for fixing the lead fingers of the leadframe is prepared. The tape includes an electrically-insulating base film and an adhesive layer formed on a surface of the base film.

(c) The tape is adhered to the lead fingers to thereby fix the lead fingers at their original positions by contacting the adhesive layer of the tape with the lead fingers under application of a pressing force.

In the step (c), the lead fingers are partially sunk into the adhesive layer of the tape to form protruded parts of the adhesive layer at respective sides of each of the lead fingers. Intervening parts of the adhesive layer are formed between two adjoining ones of the protrusions, and depressed parts of the adhesive layer are formed to be opposite to the lead fingers. The protruded parts are thicker than the intervening parts. The depressed parts are thinner than the intervening parts.

With the method according to the second aspect of the present invention, the configuration of the adhesive layer of the tape according to the first aspect is obtained by contacting the adhesive layer of the tape with the lead fingers under application of a pressing force in the step (c).

Therefore, the tape-fixed lead fingers according to the first aspect is fabricated with simple steps.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
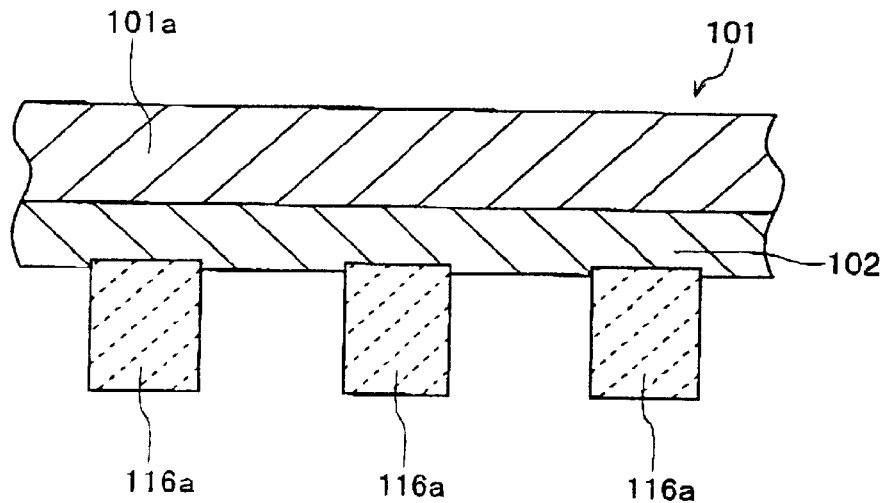
FIG. 1 is an enlarged, partial, cross-sectional view of a conventional tape-fixed leadframe.

A preferred embodiment of the present invention will be described in detail below while referring to the drawings attached.

FIGS. 3 to 6 show a tape-fixed leadframe according to an embodiment of the present invention.

Figure 3:
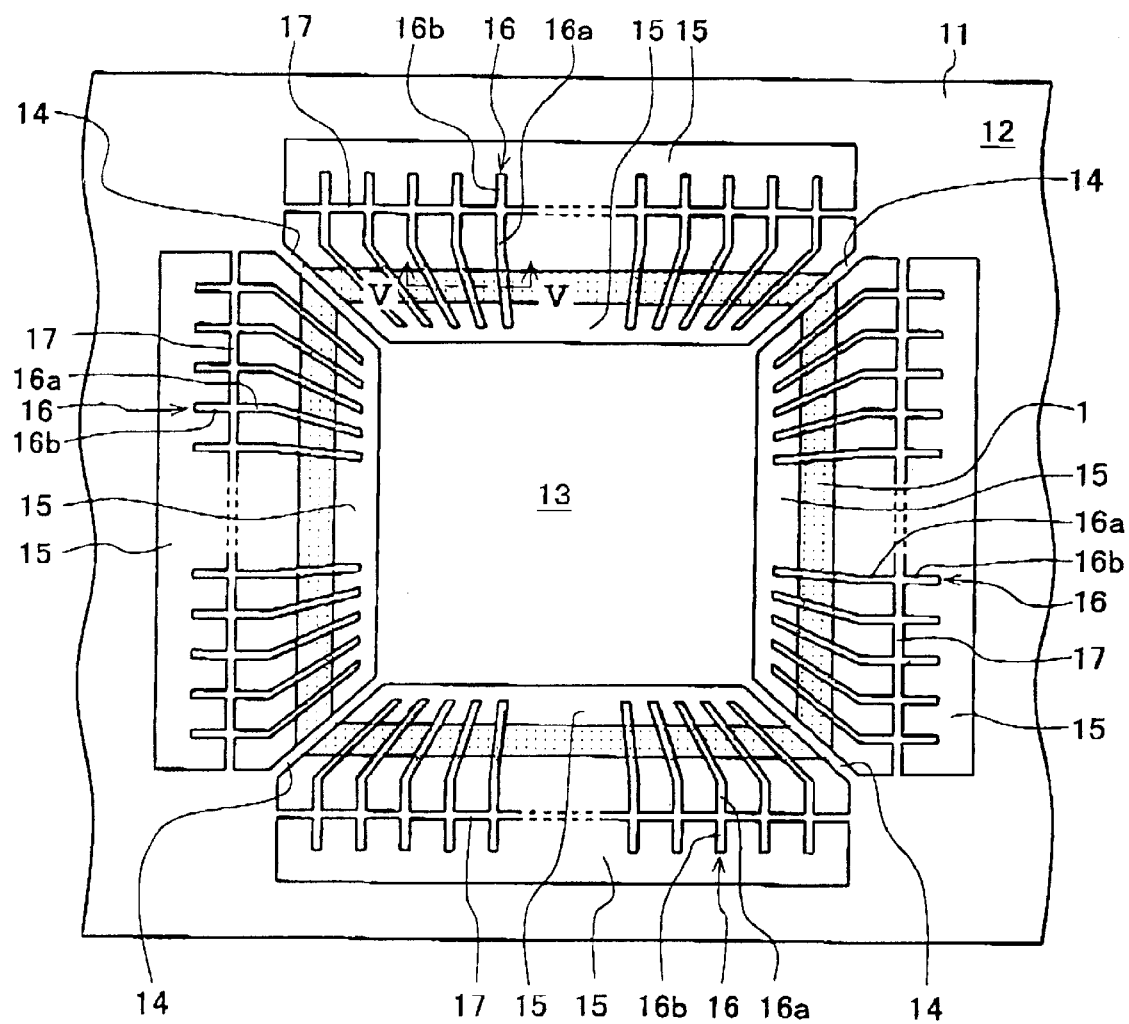
FIG. 3 is a partial, plan view of a tape-fixed leadframe according to an embodiment of the present invention, in which only one set of, lead fingers are shown.

As shown in FIG. 3, a leadframe 11 has a strip-shaped body 12, a pair of rails (not shown) formed at each side of the body 12 to extend along the longitudinal axis thereof, and patterned die-mounting structures arranged at regular intervals along the longitudinal axis of the body 12. Only one of the structures is shown in FIG. 3 for the sake of simplification of description.

The die-mounting structures are formed through an etching or stamping process in popular.

The body 12 is made of a copper-system alloy.

Each of the die-mounting structures includes a square die pad 13 for mounting a semiconductor die or chip (not shown) thereon, four die pad supports 14 for supporting the die pad 13, lead fingers 16 for forming inner 16a and outer 16b, and tiebars or dam-bars 17 for preventing leakage of a molding material or compound during a molding process. Each of the die-mounting structures is located in a window 15 of the body 12.

The square die pad 13 is positioned at the middle point of the body 12. The lead fingers 16 and corresponding tiebars 17 are arranged to be opposite to each side of the die pad 13. Each of the tiebars 17 is formed to interconnect the adjacent two lead fingers 16 or the end-positioned lead finger 16 and the body 12. The tiebars 17 are aligned along each side of an imaginary square.

Each of the die pad supports 14 extends from a corresponding corner of the imaginary square to an opposing corner of the die pad 13 so that it mechanically connects the die pad 13 to the body 12. As a result, the die pad 13 is supported only by the die pad supports 14.

The lead fingers 16 are formed to protrude from the inner periphery of the window 15 toward the four sides of the die pad 13, respectively the inner parts of the lead fingers 16, which are near the die pad 13, serve as the inner 16a. The outer parts of the lead fingers 16, which are far from the die pad 13, serve as the outer 16b.

The pitch of the inner 16a is 0.2 mm.

As clearly shown in FIG. 3, a fixing tape 1 having a square-ringed shape is adhered to the inner 16a for fixing them.

Figure 5:
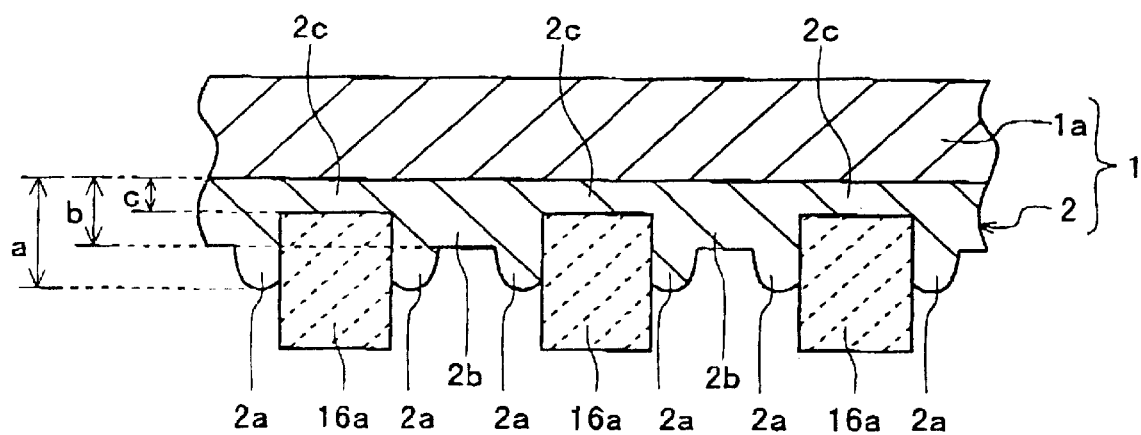
FIG. 5 is an enlarged, partial, cross-sectional view showing the fabrication method of the tape-fixed leadframe according to the embodiment of the present invention, in which the fixing tape is adhered onto the inner leads of the leadframe.

As shown in FIG. 5, the fixing tape 1 is formed by an electrically-insulating base film 1a and an electrically-insulating adhesive layer 2 coated on one side of the base film 1a. The base film 1a is made of an electrically-insulating, organic material such as polyimide. The adhesive layer 2 is made of an electrically-insulating mixture of an NBR and a synthetic resin such as phenol resin and polyimide resin.

The fixing tape 1 is adhered onto the inner 16a by pressing the adhesive layer 2 to the inner 16a by a weak force. Thus, the inner 16a are fixed at their original positions by the adhesion strength of the adhesive layer 2, so that two adjacent ones of the inner 16a are prevented from being contacted with one another.

As clearly seen from FIG. 5, in the adhered state, the adhesive layer 2 of the fixing tape 1 has protruded parts 2a located at respective sides of each of the inner 16a, intervening parts 2b between two adjoining ones of the protruded parts 2a, and depressed parts 2c opposite to the inner 16a.

The protruded parts 2a have a thickness a larger than a thickness b of the intervening parts 2b. The depressed parts 2c have a thickness a smaller than the thickness b of the intervening parts 2b.

Here, the fixing tape 1 is approximately 50 μm in thickness, where the base film 1a is approximately 30 μm in thickness, the adhesive layer 2 is approximately 20 μm in thickness.

The thickness a of the protruded parts 2a of the adhesive layer 2 is approximately 50 μm. The thickness b of the intervening parts 2b of the adhesive layer 2 is approximately 20 μm. The thickness c of the depressed parts 2c of the adhesive layer 2 is approximately 10 μm. Therefore, the thickness a of the protruded parts 2a is approximately equal to 2.5 times the thickness b of the intervening parts 2b.

The tape-fixed leadframe according to the embodiment of the present invention is fabricated in the following way.

Figure 4:
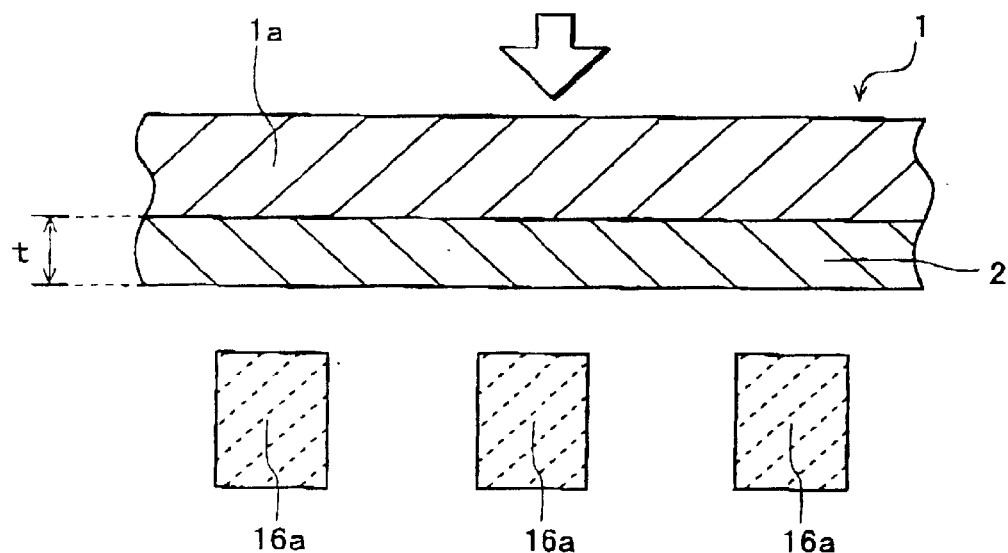
FIG. 4 is an enlarged, partial, cross-sectional view showing a fabrication method of the tape-fixed leadframe according to the embodiment of the present invention, in which a fixing tape is apart from inner leads of the leadframe.

First, the leadframe 11 having the configuration shown in FIG. 3 is prepared. On the other hand, the electrically-insulating tape 1 having the configuration shown in FIGS. 3 and 4 is prepared. The square-ringed shape of the tape 1 is realized by a punching process.

Next, as shown in FIG. 4, the punched tape 1 is adhered onto the inner 16a to link them together by contacting the adhesive layer 2 of the tape 1 with the inner 16a under application of a pressing force. The direction of the pressing force is illustrated by an arrow in FIG. 4.

In this adhesion step, the inner 16a are pressed to be partially sunk into the adhesive layer 2 of the tape 1, thereby forming the protruded parts 2a at the respective sides of each of the inner 16a and the depressed parts 2c to be opposite to the inner 16a, as shown in FIG. 5. Thus, the intervening parts 2b of the adhesive layer 2 are automatically formed between two adjoining ones of the protruded parts 2a.

It is clear from this adhesion step that the protruded parts 2a become thicker than the intervening parts 2b, and the depressed parts 2c become thinner than the intervening parts 2b.

The partial sinking of the inner 16a is realized by adjusting the pressing force and the ambient temperature (or, softness of the adhesive layer 2) and/or by selecting the material of the adhesive layer 2.

Through the above-described method, the configuration of the adhesive layer 2 of the fixing tape 1 according to the embodiment is obtained with simple steps.

Figure 6:
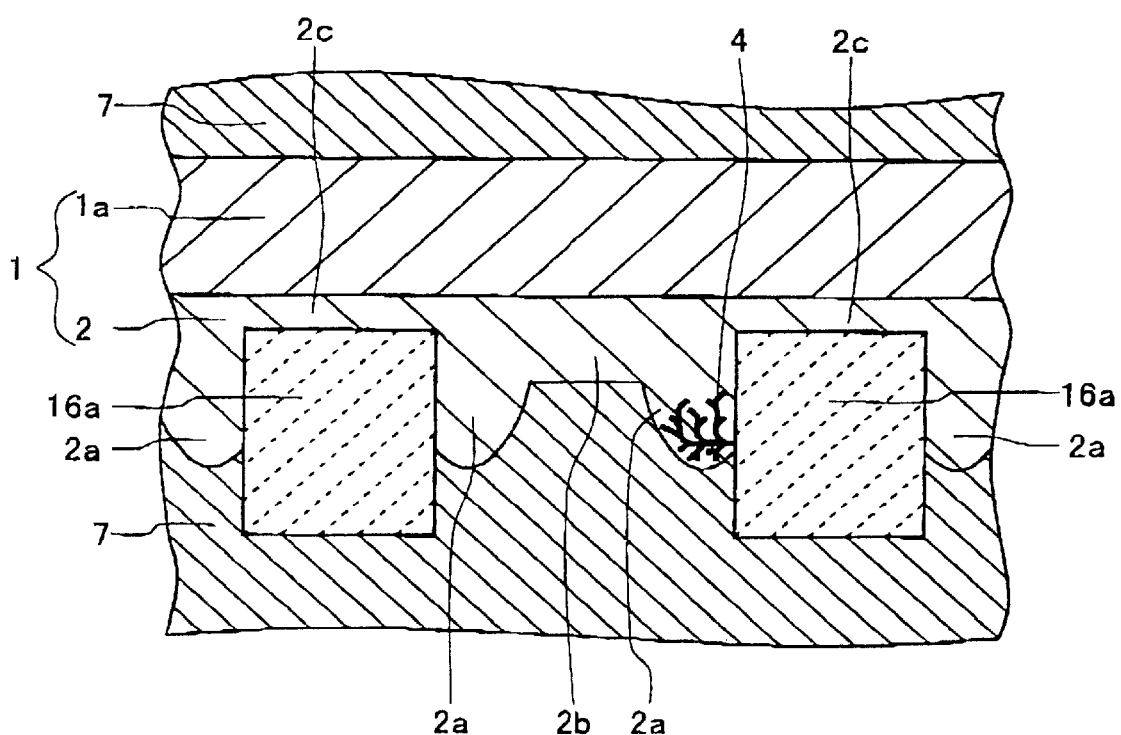
FIG. 6 is an enlarged, partial, cross-sectional view of the tape-fixed leadframe according to the embodiment of the present invention, in which the leadframe and the tape are buried in a molding plastic.

With the tape-fixed leadframe according to the embodiment of the present invention, the adhesive layer 2 has the protruded parts 2a located at the respective sides of each of the inner leads 16a and the intervening parts 2b between two adjoining ones of the protruded parts 2a. Therefore, ionized atoms of copper contained in the inner 16a are trapped by the protruded parts 2a and as a result, ion migration of the copper is prevented from occurring with a simple configuration After a predesigned plastic molding process, the inner 16a and the fixing tape 1 are entirely buried in a molding or encapsulating material 7 such as epoxy resin, as shown in FIG. 6.

Next, the deposition process of metallic copper is explained in detail.

The starting point of the metallic copper deposition is located near the contact areas between the inner 16a and the adhesive layer 2. The reason is that copper ions are most readily reduced by exposure to the atmosphere in the contact areas.

Figure 2:
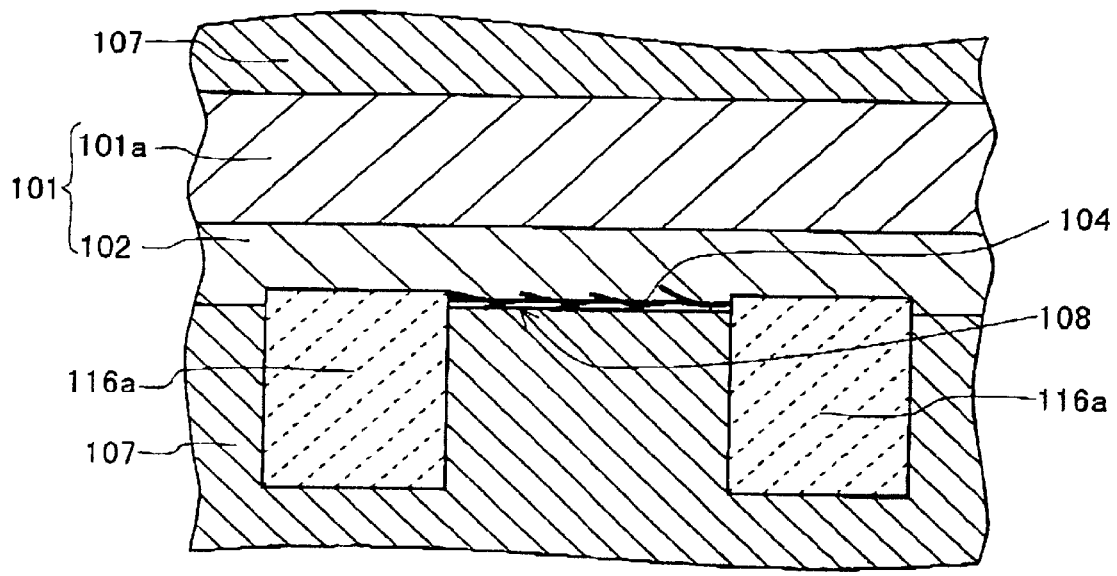
FIG. 2 is an enlarged, partial, cross-sectional view of the conventional tape-fixed leadframe shown in FIG. 1, in which the leadframe and the tape are buried in a molding plastic.

In the conventional tape-fixed leadframe shown in FIG. 1, the thickness of the adhesive layer 102 is entirely uniform, as shown in FIG. 2. Therefore, the metallic copper deposition occurs successively along the surface of the adhesive layer 102, resulting in a linear shape like a dendrite crystal, as shown in FIG. 2.

This is because every starting point of the copper deposition is affected through the adhesive layer 102 by electric fields existing between the inner leads 116a and consequently, new metallic copper is successively deposited at the top of the previously-deposited metallic copper 104.

On the other hand, in the tape-fixed leadframe according to the embodiment of the invention shown in FIG. 5, the adhesive layer 2 has the protruding parts 2a and the intervening parts 2b. Therefore, no electric fields is generated at the starting point of the copper deposition through the adhesive layer 2. In this case, metallic copper 4 is deposited not only along the surface of the adhesive layer 2 and but also perpendicular thereto.

Consequently, it seems that deposited metallic copper 4 is trapped in the protruded parts 2a of the adhesive layer 2, as shown in FIG. 6. This drastically prolongs the period of time until electric short circuit takes place due to the copper deposition.

TESTS

The inventor conducted the following tests to confirm the advantage of the tape-fixed leadframe (sample Nos. 2 and 3) according to the embodiment of the present invention shown in FIG. 5 and the conventional one (sample No. 1) shown in FIG. 1 through the accelerated evaluation. These sample Nos. 1, 2, and 3 included a same leadframe and a same fixing tape.

The testing samples (sample Nos. 1, 2, and 3) were molded by packages of a same epoxy resin, in which the sample Nos. 1 and 2 were patterned by etching, and the sample No. 3 was patterned by punching. The number of each testing sample was 24.

The tests were made under the different conditions A and B shown below.

In the condition A, the temperature was set as 150° C., the humidity was set as the typical room humidity (70%), and a dc voltage of 5.5 V was applied across the two adjacent ones of the inner leads.

In the condition B, the temperature was set as 85° C., the humidity was set as 85%, and a dc voltage of 5.5 V was applied across the two adjacent ones of the inner leads.

The results of the tests are shown in Table 1 listed below, in which the dimension a, b, and c denote the thicknesses a, b, and c of the protruding and intervening parts of the adhesive layer, respectively. In the sample Nos. 1, 2, and 3, the values of the ratio (a/b) are 1, 2, and approximately 2.1, respectively.

TABLE 1

| No. | DIMENSION | | | CONDITION A | | | | CONDITION B | | |
|---|---|---|---|---|---|---|---|---|---|---|
| | a (μm) | b (μm) | a/b | 168 h | 500 h | 1000 h | 2000 h | 168 h | 500 h | 1000 h |
| 1 | 25 | 25 | 1 | 2/24 | 3/22 | 7/19 | — | 0/24 | 1/24 | 2/23 |
| 2 | 50 | 25 | 2 | 0/24 | 0/24 | 0/24 | 0/24 | 0/24 | 0/24 | 0/24 |
| 3 | 48 | 23 | 2.1 | 0/24 | 0/24 | 0/24 | 0/24 | 0/24 | 0/24 | 0/24 |

As seen from the sample No. 1 in Table 1, the number of defective (short-circuit) samples increases in the conventional leadframe as the testing time passes, which is due to ion migration of copper. On the other hand, as seen from the sample Nos. 2 and 3, no defective samples is observed in the embodiment of the invention even as the testing time passes.

Also, defective (short-circuit) samples are observed in the conventional leadframe after 168 hours have passed. On the other hand, no defective samples is observed even after 200 hours have passed in the embodiment of the invention.

Accordingly, it Is estimated that the embodiment of the invention has a lifetime approximately five times as long as the conventional one.

While the preferred form of the present invention has been described, it is to be understood that modifications will be apparent to those skilled in the art without departing from the spirit of the invention. The scope of the invention, therefore, is to be determined solely by the following claims.

What is claimed is:

1. A tape-fixed leadframe comprising:

electrically-conductive lead fingers;

an electrically-insulating tape for fixing said lead fingers;

said tape including an electrically-insulating base film and an electrically-insulating adhesive layer formed on a surface of said base film;

said adhesive layer of said tape being adhered to said lead fingers, thereby fixing said lead fingers at their original positions;

said adhesive layer having protruded parts located at respective sides of each of said lead fingers, intervening parts between two adjoining ones of said protruded parts, and depressed parts opposite to said lead fingers;

said protruded parts being thicker than said intervening parts;

said depressed parts being thinner than said intervening parts; and wherein ionized atoms of a metal contained in said lead fingers are trapped by said protruded parts.

2. A leadframe as claimed in claim 1, wherein a thickness of said protruded parts is equal to approximately twice as much as a thickness of said intervening parts or more.

3. A leadframe as claimed in claim 1, wherein said lead fingers contain copper;

and wherein ionized atoms of copper are trapped by said protruded parts.

* * * * *